(12) United States Patent  
Gotti et al.

(10) Patent No.: US 9,299,929 B2  
(45) Date of Patent: Mar. 29, 2016

(54) PHASE CHANGE MEMORY CELLS INCLUDING NITROGENATED CARBON MATERIALS, AND RELATED METHODS

(71) Applicant: Micron Technology, Inc., Boise, ID (US)

(72) Inventors: Andrea Gotti, Boise, ID (US); Luca Fumagalli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/727,106

(22) Filed: Jun. 1, 2015

(65) Prior Publication Data

US 2015/0263281 A1    Sep. 17, 2015

Related U.S. Application Data

(62) Division of application No. 13/215,706, filed on Aug. 23, 2011, now Pat. No. 9,054,295.

(51) Int. Cl.
  *H01L 21/8239*    (2006.01)
  *H01L 45/00*    (2006.01)
  *H01L 27/24*    (2006.01)

(52) U.S. Cl.
  CPC ........ *H01L 45/1293* (2013.01); *H01L 27/2463* (2013.01); *H01L 45/06* (2013.01); *H01L 45/1253* (2013.01); *H01L 45/143* (2013.01); *H01L 45/144* (2013.01); *H01L 45/1616* (2013.01); *H01L 45/1625* (2013.01)

(58) Field of Classification Search
  CPC ....... H01L 45/06; H01L 27/249; H01L 45/14; H01L 45/04; H01L 45/12; H01L 45/1253; H01L 45/143; H01L 45/144; H01L 31/0324; H01L 21/02417; H01L 27/2463; G11C 13/0002–13/00
  See application file for complete search history.

(56) References Cited

U.S. PATENT DOCUMENTS

| | | | |
|---|---|---|---|
| 5,536,947 A | 7/1996 | Klersy et al. | |
| 5,616,374 A | 4/1997 | Sho et al. | |
| 5,751,012 A * | 5/1998 | Wolstenholme | .... H01L 27/1021 257/2 |
| 5,825,046 A * | 10/1998 | Czubatyj | ............ G11C 13/0004 257/2 |
| 6,800,504 B2 | 10/2004 | Li et al. | |
| 7,115,927 B2 | 10/2006 | Hideki et al. | |
| 7,473,950 B2 * | 1/2009 | Fournier | ................. H01L 45/04 257/295 |
| 7,667,218 B2 | 2/2010 | Yamamoto et al. | |
| 7,791,932 B2 | 9/2010 | Kuh et al. | |
| 7,858,152 B2 | 12/2010 | Ovshinsky et al. | |
| 7,884,347 B2 | 2/2011 | Yoon et al. | |
| 7,943,922 B2 | 5/2011 | Fournier | |
| 8,075,973 B2 * | 12/2011 | Nishihara | ............. G11B 7/2578 428/64.1 |
| 8,133,566 B2 * | 3/2012 | Nishihara | .......... G11B 7/24038 428/64.1 |
| 8,237,143 B2 * | 8/2012 | Toda | ........................ G11C 5/02 257/2 |
| 8,263,958 B2 * | 9/2012 | Campbell | .......... G11C 13/0011 257/2 |
| 8,334,186 B2 * | 12/2012 | Campbell | ............. H01L 45/085 257/E45.002 |

(Continued)

*Primary Examiner* — Laura Menz  
*Assistant Examiner* — Maliheh Malek  
(74) *Attorney, Agent, or Firm* — TraskBritt

(57) ABSTRACT

A phase change memory cell comprising a first chalcogenide compound on a first electrode, a first nitrogenated carbon material directly on the first chalcogenide compound, a second chalcogenide compound directly on the first nitrogenated carbon material, and a second nitrogenated carbon material directly on the second chalcogenide compound and directly on a second electrode. Other phase change memory cells are described. A method of forming a phase change memory cell and a phase change memory device are also described.

20 Claims, 9 Drawing Sheets

(56) References Cited

U.S. PATENT DOCUMENTS

| | | | |
|---|---|---|---|
| 8,344,348 B2* | 1/2013 | Wicker | H01L 45/04 257/2 |
| 8,350,661 B2* | 1/2013 | Czubatyj | G11C 13/0004 338/22 R |
| 8,377,741 B2* | 2/2013 | Savransky | H01L 27/2427 257/2 |
| 8,395,138 B2* | 3/2013 | Yamamoto | H01L 45/1233 257/1 |
| 8,569,730 B2* | 10/2013 | Xu | H01L 27/101 257/2 |
| 8,766,228 B2* | 7/2014 | Yang | H01L 21/2254 257/214 |
| 2006/0278900 A1 | 12/2006 | Chang et al. | |
| 2007/0221906 A1 | 9/2007 | Hideki et al. | |
| 2007/0284635 A1 | 12/2007 | Fournier | |
| 2008/0073637 A1* | 3/2008 | Kuh | H01L 27/2409 257/4 |
| 2008/0075843 A1 | 3/2008 | Kuh et al. | |
| 2008/0145702 A1 | 6/2008 | Shin et al. | |
| 2009/0029031 A1 | 1/2009 | Lowrey | |
| 2009/0146130 A1 | 6/2009 | Fournier | |
| 2009/0168491 A1* | 7/2009 | Schricker | B82Y 10/00 365/148 |
| 2009/0179186 A1 | 7/2009 | Arnold et al. | |
| 2009/0180314 A1 | 7/2009 | Liu | |
| 2009/0250682 A1* | 10/2009 | Park | H01L 27/2463 257/4 |
| 2009/0258477 A1* | 10/2009 | Ryoo | H01L 27/2409 438/482 |
| 2009/0275198 A1 | 11/2009 | Kamepalli et al. | |
| 2010/0012912 A1* | 1/2010 | Schricker | H01L 27/101 257/2 |
| 2010/0019216 A1 | 1/2010 | Park et al. | |
| 2010/0038617 A1* | 2/2010 | Nakajima | H01L 27/24 257/2 |
| 2010/0084625 A1 | 4/2010 | Wicker et al. | |
| 2010/0096609 A1 | 4/2010 | Kim et al. | |
| 2010/0301988 A1* | 12/2010 | Czubatyj | G11C 13/0004 338/13 |
| 2011/0024713 A1 | 2/2011 | Kamata et al. | |
| 2011/0059557 A1* | 3/2011 | Yamagishi | H01L 27/228 438/3 |
| 2011/0140064 A1 | 6/2011 | Bandyopadhyay | H01L 27/24 257/2 |
| 2011/0149645 A1 | 6/2011 | Liu | |
| 2011/0207285 A1* | 8/2011 | Kim | H01L 27/24 438/382 |
| 2011/0233503 A1* | 9/2011 | Hwang | H01L 27/24 257/2 |
| 2011/0233507 A1* | 9/2011 | Sonehara | H01L 27/224 257/4 |
| 2011/0300685 A1* | 12/2011 | Horii | H01L 27/2409 438/382 |
| 2012/0178209 A1* | 7/2012 | Quick | C23C 16/45534 438/102 |
| 2013/0017663 A1 | 1/2013 | Park et al. | |
| 2013/0048935 A1 | 2/2013 | Gotti et al. | |
| 2013/0078475 A1 | 3/2013 | Zheng | |
| 2013/0112933 A1* | 5/2013 | Zheng | C22C 28/00 257/3 |
| 2013/0126822 A1* | 5/2013 | Pellizzer | H01L 45/1233 257/5 |
| 2013/0187111 A1* | 7/2013 | Erbetta | H01L 45/06 257/2 |
| 2014/0166956 A1* | 6/2014 | Higuchi | H01L 45/1608 257/1 |
| 2014/0239245 A1 | 8/2014 | Lengade et al. | |
| 2015/0041749 A1* | 2/2015 | Liu | H01L 45/165 257/4 |
| 2015/0084156 A1* | 3/2015 | Ravasio | H01L 45/04 257/528 |
| 2015/0123066 A1* | 5/2015 | Gealy | H01L 45/06 257/4 |
| 2015/0179706 A1* | 6/2015 | Rocklein | H01L 27/2481 257/4 |

* cited by examiner

PHASE CHANGE MEMORY CELLS INCLUDING NITROGENATED CARBON MATERIALS, AND RELATED METHODS

CROSS-REFERENCE TO RELATED APPLICATION

This application is a divisional of U.S. patent application Ser. No. 13/215,706, filed Aug. 23, 2011, now U.S. Pat. No. 9,054,295, issued Jun. 9, 2015, the disclosure of which is hereby incorporated herein in its entirety by this reference.

TECHNICAL FIELD

The present disclosure relates generally to phase change memory cells. More specifically, embodiments of the present disclosure relate to phase change memory cells including nitrogenated carbon materials, methods of forming such phase change memory cells, and phase change memory devices including such nitrogenated carbon materials.

BACKGROUND

Non-volatile memory devices are an important element of integrated circuits due to their ability to maintain data absent a power supply. Phase change materials have been investigated for use in non-volatile memory cells. Phase change memory cells include phase change materials, such as chalcogenide compounds, which are capable of stably transitioning between physical states (e.g., amorphous, semi-amorphous, and crystalline states). Each physical state exhibits a particular resistance that may be used to distinguish logic values of the memory cell.

A conventional phase change memory cell includes a layer of phase change material between a first electrode and a second electrode. A portion of the phase change memory cell is set to a particular resistance state according to an amount of current applied by the first electrode and the second electrode. To obtain an amorphous state, a high current pulse is applied to the phase change material for a short period of time to melt a portion of the phase change material. The current is removed and the phase change memory cell cools rapidly to below the glass transition temperature of the phase change material. To obtain a crystalline state, a lower current pulse is applied to the phase change material for a longer period of time to heat the phase change material to below its melting point, causing the amorphous state to re-crystallize to a crystalline state that remains after the current is removed.

Conventional phase change memory cells typically also include an isolation element. Within a conventional phase change memory device, a plurality of phase change memory cells are positioned between a plurality of access lines (e.g., word lines) and a plurality of digit lines (e.g., bit lines). Each access line is connected to a row of phase change memory cells and each digit line is connected to a column of phase change memory cells. A single phase change memory cell is selected for reading or writing by applying a voltage between the access line and the digit line to which the single phase change memory cell is connected. Including an isolation element in the phase change memory cell impairs or, ideally, prevents residual voltages from affecting the physical state of non-selected phase change memory cells. Threshold switching materials are currently considered favorable isolation elements. One threshold switching material is a chalcogenide compound having an OFF state that is relatively resistive (i.e., precluding current leaks) and an ON state that is relatively conductive. The ON state of the threshold switching material is enabled when a voltage across the threshold switching material is greater than a critical threshold value of the threshold switching material.

Disadvantageously, conventional phase change memory devices require large amounts of energy to generate the heat to produce a detectable resistance change in the plurality of phase change memory cells. The electrodes used to generate such heat are often insufficiently resistive. Conventional electrodes also frequently exhibit poor resistivity stability over varied temperatures and have a tendency to be chemically reactive with the phase change material of the phase change memory cell, which can result in limited memory cell lifespan, performance degradation, and even delamination of the phase change material. Additionally, conventional electrode materials do not exhibit good adhesion with phase change materials. Further, conventional electrodes often have textured, uneven, or rough surfaces that can protrude through a portion of the phase change material and negatively affect memory characteristics.

There remains a need for a phase change memory cell and a phase change memory device providing the benefits of a threshold switching material without one or more of the foregoing disadvantages of conventional phase change memory cells and devices.

DETAILED DESCRIPTION

Figure 1:
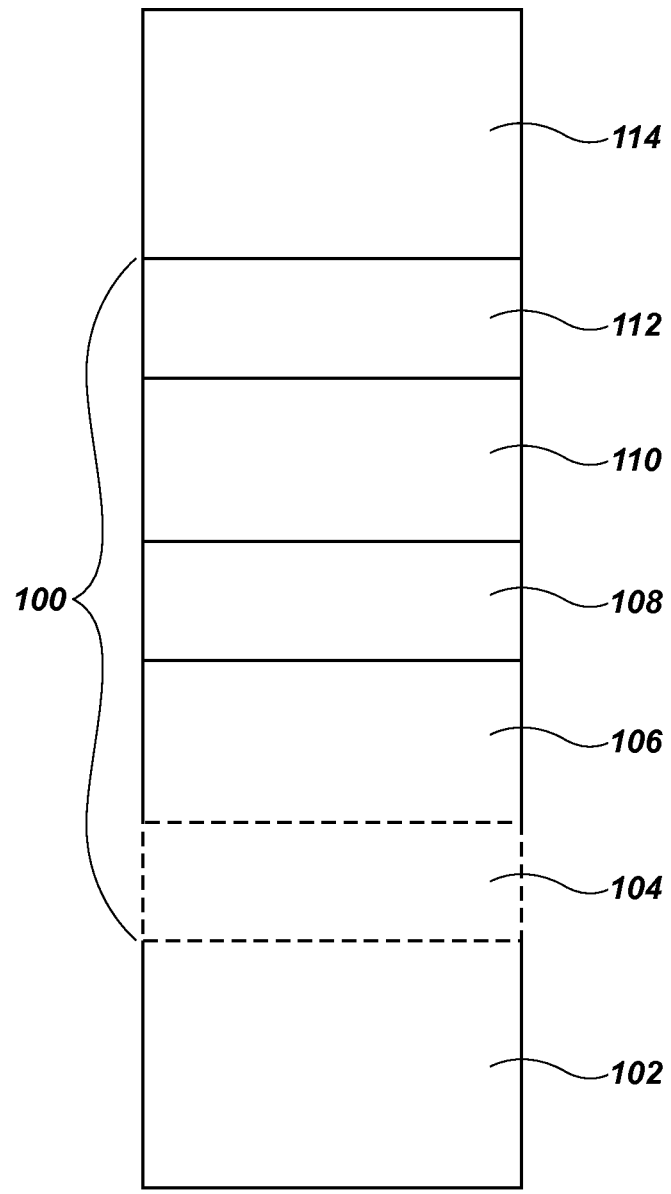
FIG. 1 is a cross-sectional view of a phase change memory cell, in accordance with an embodiment of the disclosure.

Phase change memory cells, methods of forming such phase change memory cells, and phase change memory devices including the phase change memory cells are disclosed. The phase change memory cell includes at least one nitrogenated carbon material, which may function as at least one of an electrode and an adhesion material. The nitrogenated carbon material may be a crystalline material including carbon atoms and nitrogen atoms. The phase change memory cells utilizing the nitrogenated carbon materials may exhibit increased adhesion strength, improved surface smoothness, higher resistivity, improved resistivity stability with temperature change, reduced hysteresis and degradation, and reduced power consumption requirements relative to conventional phase change memory cells.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. In addition, the description provided herein does not form a complete process flow for forming a phase change memory cell, and each of the phase change memory cells and phase change memory devices described below do not form a complete semiconductor device. Only those process acts and structures necessary to understand the embodiments of the present disclosure are described in detail below.

In the following description, reference is made to the accompanying drawings, which form a part hereof, and in which is shown, by way of illustration, specific embodiments in which the disclosure may be practiced. These embodiments are described in sufficient detail to enable a person of ordinary skill in the art to practice the disclosure. However, other embodiments may be utilized, and structural, logical, and electrical changes may be made without departing from the scope of the disclosure. The illustrations presented herein are not meant to be actual views of any particular phase change memory cell, phase change memory array, or phase change memory device but are merely idealized representations that are employed to describe embodiments of the present disclosure. The drawings presented herein are not necessarily drawn to scale. Additionally, elements common between drawings may retain the same numerical designation.

As used herein, while the terms "first," "second," "third," etc., may describe various elements, components, regions, layers, and/or sections, none of which are limited by these terms. These terms are used only to distinguish one element, component, region, material, layer, or section from another element, component, region, material, layer, or section. Thus, "a first element," "a first component," "a first region," "a first material," "a first layer," or "a first section" discussed below could be termed a second element, a second component, a second region, a second material, a second layer, or second section without departing from the teachings herein.

As used herein, reference to an element as being "on" another element means and includes the element being directly on top of, adjacent to, underneath, or in direct contact with the other element. It also includes the element being indirectly on top of, adjacent to, underneath, or near the other element, with at least one other element present therebetween. In contrast, when an element is referred to as being "directly on" another element, there are no intervening elements present.

One embodiment of the present disclosure will now be described with reference to FIG. 1, which illustrates a phase change memory cell 100 including an optional first nitrogenated carbon material 104, a phase change material 106, a second nitrogenated carbon material 108, a threshold switching material 110, and a third nitrogenated carbon material 112. The phase change memory cell 100 may be coupled to a first electrode 102 and a second electrode 114. As shown in FIG. 1, the first nitrogenated carbon material 104 may, optionally, be formed on the first electrode 102, the phase change material 106 may be formed on the first nitrogenated carbon material 104 (if present), the second nitrogenated carbon material 108 may be formed on the phase change material 106, the threshold switching material 110 may be formed on the second nitrogenated carbon material 108, the third nitrogenated carbon material 112 may be formed on the threshold switching material 110, and the second electrode 114 may be formed on the third nitrogenated carbon material 112.

The first electrode 102 may include any suitable conductive material including, but not limited to, a metal, a metal alloy, a conductive metal oxide, or combinations thereof. For example, the first electrode 102 may be formed from tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof. In at least some embodiments, the first electrode 102 is formed from W. The first electrode 102 may be formed in, on, or over a substrate (not shown) using conventional techniques, such as a physical vapor deposition ("PVD") technique, a chemical vapor deposition ("CVD") technique, or an atomic layer deposition ("ALD") technique. PVD includes, but is not limited to, sputtering, evaporation, or ionized PVD. Such deposition techniques are known in the art and, therefore, are not described in detail herein. The substrate may be a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate including a layer of semiconductive material. The bulk substrate may include, but is not limited to, silicon, silicon-on-insulator ("SOI"), silicon-on-sapphire ("SOS"), epitaxial silicon on a base semiconductor foundation, or another semiconductor or optoelectrical material, such as silicon-germanium, germanium, gallium arsenide, or indium phosphide. The substrate may be doped or undoped.

The first nitrogenated carbon material 104, if present, may be a non-stoichiometric compound including carbon (C) atoms and nitrogen (N) atoms. As used herein, the term "non-stoichiometric compound" means and includes a chemical compound with an elemental composition that cannot be represented by a ratio of well-defined natural numbers and is in violation of the law of definite and multiple proportions. The first nitrogenated carbon material 104 may function as an electrode configured to conduct current to the phase change material 106. The first nitrogenated carbon material 104 may include a nitrogen content ranging from about 0.10 atomic percent nitrogen to about 20 atomic percent nitrogen, such as from about 0.5 atomic percent nitrogen to about 10 atomic percent nitrogen. The amount of carbon in the first nitrogenated carbon material 104 may be greater than the amount of nitrogen in the first nitrogenated carbon material 104. By way of non-limiting example, the first nitrogenated carbon material 104 may have an atomic percentage of carbon greater than or equal to about 80 percent and an atomic percentage of nitrogen less than or equal to about 20 percent, such as greater than or equal to about 90 atomic percent carbon and less than or equal to about 10 atomic percent nitrogen, greater than or equal to about 95 atomic percent carbon and less than or equal to about 5 atomic percent nitrogen, greater than or equal to about 97 atomic percent carbon and less than or equal to about 3 atomic percent nitrogen, or greater than or equal to about 99 atomic percent carbon and less than or equal to about 1 atomic percent nitrogen. The first nitrogenated carbon material 104, if present, may include an atomic percentage of nitrogen within a range of from about 0.10 atomic percent nitrogen to about 20 atomic percent nitrogen, such as from about 0.5 atomic percent nitrogen to about 10 atomic percent nitrogen. In at least some embodiments, the first nitrogenated carbon material 104 has an atomic percentage of carbon of about 95 percent and an atomic percentage of nitrogen of about 5 percent. The nitrogen content of the first nitrogenated carbon material 104 may enable the first nitrogenated carbon material 104 to have increased resistivity and increased resistivity stability with temperature variation as compared to conventional electrodes, such as carbon electrodes.

The first nitrogenated carbon material 104, if present, may have a uniform nitrogen concentration profile. As used herein, the term "uniform nitrogen concentration profile" means and includes a concentration profile of nitrogen that does not vary by more than about 0.5 percent of an average nitrogen concentration for a thickness of a region of the material. Alternatively, the first nitrogenated carbon material 104 may have a non-uniform nitrogen concentration profile. If the first nitrogenated carbon material 104 has a non-uniform nitrogen concentration profile, a nitrogen concentration may vary stepwise or may vary continuously. As used herein, the term "vary stepwise" means and includes a concentration profile where a nitrogen concentration may change abruptly within a thickness of a region of the material. As used herein, the term "vary continuously" means and includes a concentration profile where a nitrogen concentration may change progressively (e.g., linearly or parabolically) throughout a thickness of a region of the material. The non-uniform concentration profile may simultaneously provide a thickness of a region of the material with advantageous thermal insulation properties and advantageous electrical resistivity properties. The non-uniform concentration profile may be substantially undetectable by visual detection, but may be detectable by conventional spectroscopy or spectrometry techniques.

The thickness of the first nitrogenated carbon material 104 may be selected at least partially based on material characteristics of one or more other components of the phase change memory cell 100 (e.g., the phase change material 106, the second nitrogenated carbon material 108, the threshold switching material 110). For example, the thickness of the first nitrogenated carbon material 104 may enable a threshold voltage of the first nitrogenated carbon material 104 (e.g., a voltage at which the first nitrogenated carbon material 104 functions as a low resistance conductor) to be substantially close to a threshold voltage of the threshold switching material 110 (described below). The thickness of the first nitrogenated carbon material 104 may be within a range of from about 100 Å to about 2000 Å, such as from about 300 Å to about 1500 Å. In at least some embodiments, the thickness of the first nitrogenated carbon material 104 is about 1000 Å.

The first nitrogenated carbon material 104 may be formed on the first electrode 102 by conventional techniques including, but not limited to, PVD, CVD, or ALD. In one embodiment, the first nitrogenated carbon material 104 is formed by PVD, so that the first nitrogenated carbon material 104 has high film quality, as well as high thermal compatibility with the phase change material 106. By way of non-limiting example, a carbon source, such as graphite, may be provided in a deposition chamber (not shown), such as a PVD chamber, that is configured to receive nitrogen gas at a flow rate of from about 0.1 standard cubic centimeters per minute (sccm) to about 50 sccm, and further configured to generate a plasma including a noble gas element (e.g., helium, neon, argon, krypton, xenon, or radon). In at least one embodiment, the plasma includes argon. Conditions, such as temperature and pressure, for generating and maintaining the plasma in the chamber may be conventional and, therefore, are not described in detail herein. As the carbon source is bombarded with the plasma, carbon atoms of the carbon source are sputtered from a surface of the carbon source and form on a surface of the first electrode 102. Nitrogen atoms from the nitrogen gas may covalently bond to the carbon atoms on the first electrode 102, forming a coating of the first nitrogenated carbon material 104 on the surface of the first electrode 102. The nitrogen content of the first nitrogenated carbon material 104 may depend on the flow rate of the nitrogen gas into the chamber. The greater the flow rate of the nitrogen gas into the PVD chamber, the greater the atomic percentage of nitrogen incorporated into the first nitrogenated carbon material 104. If a non-uniform nitrogen concentration profile is desired, the flow rate of the nitrogen gas into the chamber may be increased or decreased in a stepwise manner or a continuous manner during the deposition process. A desired thickness of the first nitrogenated carbon material 104 may be achieved by controlling a deposition time and an amount of power used. Suitable PVD chambers are commercially available including, but not limited to, an Entron EX300 RF sputtering chamber, which is available from Ulvac Technologies, Inc. (Methuen, Mass.).

The phase change material 106 may be any known material capable of being electrically switched or changed (i.e., configured to reversibly electrically switch or change) between a first phase and a second phase, where the first phase and the second phase differ in at least one detectable (e.g., measurable) property (e.g., electrical resistivity, electrical conductivity, optical transmissivity, optical absorption, optical refraction, optical reflectivity, morphology, surface topography, relative degree of order, relative degree of disorder, or combinations thereof). For example, applying a high current pulse to a crystalline (i.e., a relatively more ordered structure or arrangement of atoms) state of the phase change material 106 for a short time may cause the phase change material 106 to switch or change from the crystalline state having a relatively low resistivity to an amorphous (i.e., a relatively less ordered structure or arrangement of atoms) state having a relatively high resistivity. Conversely, applying a low current pulse to the amorphous state of the phase change material 106 for a long time may switch or change the phase change material 106 to the crystalline state. The phase change material 106 may also be capable of changing phases to switch between a first amorphous state and a second amorphous state, or between a first crystalline state and a second crystalline state.

By way of non-limiting example, the phase change material 106 may be a chalcogenide compound. As used herein, the term "chalcogenide compound" refers to a binary or multinary compound that includes at least one chalcogen atom and a more electropositive element or radical. As used herein, the term "chalcogen" refers to an element of Group VI of the Periodic Table, such as oxygen (O), sulfur (S), selenium (Se), or tellurium (Te). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. The chalcogenide compound may be a binary, ternary, or quaternary alloy. Non-limiting examples of chalcogenide compounds suitable for use as the phase change material 106 include Ge and Te compounds, such as GeTe; In and Se compounds, such as $In_2Se_3$; Sn and Te compounds, such as SnTe; Bi and Te compounds, such as $Bi_2Te_3$; Sb and Te compounds, such as SbTe, or $Sb_2Te_3$; Sn and Se compounds, such as SnSe; Ge and Se compounds, such as GeSe; Ga, Se, and Te compounds, such as GaSeTe; Ge, Sb, and Te compounds, such as $Ge_2Sb_2Te_5$; Sn, Sb, and Te compounds, such as $SnSb_2Te_4$; Au, Ge, Sn, and Te compounds, such as $Au_{25}Ge_4Sn_{11}Te_{60}$; Au, In, Sb, and Te compounds, such as AgInSbTe; Ag and Se compounds, such as $Ag_2Se$; In and Te compounds, such as InTe; and In, Sb, and Te (IST) compounds, such as InSbTe. In at least some embodiments, the phase change material 106 is IST.

The phase change material 106 may be formed on the first nitrogenated carbon material 104, if present, or the first electrode 102 if the first nitrogenated carbon material 104 is not present. The phase change material 106 may be formed using conventional techniques, such as PVD, CVD, or ALD, which are not described in detail herein.

The second nitrogenated carbon material 108 may be a non-stoichiometric compound including C atoms and N atoms. The second nitrogenated carbon material 108 may function as an electrode configured to conduct current to the threshold switching material 110. The second nitrogenated carbon material 108 may have an atomic percentage of nitrogen within a range of from about 0.10 atomic percent nitrogen to about 20 atomic percent nitrogen, such as from about 0.5 atomic percent nitrogen to about 10 atomic percent nitrogen. If the first nitrogenated carbon material 104 is present in the phase change memory cell 100, the amount of nitrogen in the second nitrogenated carbon material 108 may be greater than, less than, or equal to the atomic percentage of nitrogen in the first nitrogenated carbon material 104.

The second nitrogenated carbon material 108 may have a uniform nitrogen concentration profile or a non-uniform nitrogen concentration profile (e.g., stepwise, continuous, or a combination thereof). If the first nitrogenated carbon material 104 is present, the nitrogen concentration profile of the second nitrogenated carbon material 108 may be substantially the same as or may be different than the nitrogen concentration profile of the first nitrogenated carbon material 104. By way of non-limiting example, the first nitrogenated carbon material 104 may have a uniform nitrogen concentration profile and the second nitrogenated carbon material 108 may have a non-uniform nitrogen concentration profile; the first nitrogenated carbon material 104 may have a non-uniform nitrogen concentration profile and the second nitrogenated carbon material 108 may have a uniform nitrogen concentration profile; the first nitrogenated carbon material 104 may have a non-uniform nitrogen concentration profile that is varied stepwise and the second nitrogenated carbon material 108 may have a non-uniform nitrogen concentration profile that is varied continuously; the first nitrogenated carbon material 104 may have a non-uniform nitrogen concentration profile that is varied continuously and the second nitrogenated carbon material 108 may have a non-uniform nitrogen concentration profile that is varied stepwise; the first nitrogenated carbon material 104 and the second nitrogenated carbon material 108 may each have a non-uniform nitrogen concentration profile that is varied stepwise in a substantially similar or different manner; or the first nitrogenated carbon material 104 and the second nitrogenated carbon material 108 may each have a non-uniform nitrogen concentration profile that is varied continuously in a substantially similar or different manner.

Similar to the first nitrogenated carbon material 104 previously described, a thickness of the second nitrogenated carbon material 108 may be selected at least partially based on material characteristics of at least one other component of the phase change memory cell 100. The thickness of the second nitrogenated carbon material 108 may be within a range of from about 100 Å to about 7000 Å, such as from about 300 Å to about 1500 Å. In at least some embodiments, the thickness of the second nitrogenated carbon material 108 is about 1000 Å. The thickness of the second nitrogenated carbon material 108 may be greater than, less than, or equal to the thickness of the first nitrogenated carbon material 104 (if present).

The second nitrogenated carbon material 108 may be formed on the phase change material 106 in a manner substantially similar to that described above with respect to forming the first nitrogenated carbon material 104 on the first electrode 102.

The threshold switching material 110 may be any known material capable of being reversibly electrically switched (i.e., configured to reversibly electrically switch or change) from a relatively resistive state to a relatively conductive state and having substantially no tendency to undergo a structural or phase change under normal operating conditions of the phase change memory cell 100. For example, subjecting the threshold switching material 110 to a voltage above a critical threshold level may switch or change the threshold switching material 110 from the relatively resistive state to the relatively conductive state. The relatively conductive state may continue until a current passing through the threshold switching material 110 drops below a critical holding level, at which time the threshold switching material 110 may switch or change to the relatively resistive state.

By way of non-limiting example, the threshold switching material 110 may be a chalcogenide compound including a chalcogen and an electropositive element. The chalcogen may be at least one of O, S, Se, Te, or Po. The electropositive element may include, but is not limited to, N, Si, Ni, Ga, Ge, As, Ag, In, Cd, Zn, Sn, Sb, Au, Pb, Bi, or combinations thereof. The chalcogenide compound may be a binary, ternary, or quaternary alloy. Non-limiting examples of chalcogenide compounds suitable for use as the threshold switching material 110 include As and Te compounds, such as $As_2Te_3$; As and Se compounds, such as $As_2Se_3$; As, Te, and Ge compounds, such as $As_{30}Te_{45}Ge_{25}$; As, Se, and Ge compounds, such as $As_{28}Se_{42}Ge_{30}$; As, S, Se, and Ge compounds, such as $As_{30}S_{12}Se_{33}Ge_{25}$; and As, Te, Ge, Si, In compounds, such as $As_{37}Te_{39}Ge_9Si_{14}In$. In at least some embodiments, the threshold switching material 110 is $As_{37}Te_{39}Ge_9Si_{14}In$.

The threshold switching material 110 may be formed on the second nitrogenated material 108 using conventional techniques, such as PVD, CVD, or ALD, which are not described in detail herein.

The third nitrogenated carbon material 112 may be a non-stoichiometric compound including C atoms and N atoms. The third nitrogenated carbon material 112 may function as an electrode configured to conduct current to the second electrode 114. The third nitrogenated carbon material 112 may have an atomic percentage of nitrogen within a range of from about 0.10 atomic percent nitrogen to about 20 atomic percent nitrogen, such as from about 0.5 atomic percent nitrogen to about 10 atomic percent nitrogen. The amount of nitrogen in the third nitrogenated carbon material 112 may be greater than, less than, or equal to the atomic percentage of nitrogen in each of the first nitrogenated carbon material 104 (if present) and the second nitrogenated carbon material 108.

The third nitrogenated carbon material 112 may have a uniform nitrogen concentration profile or a non-uniform nitrogen concentration profile (e.g., stepwise, continuous, or a combination thereof). The nitrogen concentration profile of the third nitrogenated carbon material 112 may be the substantially the same as or may be different than the nitrogen concentration profile of each of the first nitrogenated carbon material 104 (if present) and the second nitrogenated carbon material 108. By way of non-limiting example, at least one of the first nitrogenated carbon material 104 and the second nitrogenated carbon material 108 may have a uniform nitrogen concentration profile and the third nitrogenated carbon material 112 may have a non-uniform nitrogen concentration profile; at least one of the first nitrogenated carbon material 104 and the second nitrogenated carbon material 108 may have a non-uniform nitrogen concentration profile and the third nitrogenated carbon material 112 may have a uniform nitrogen concentration profile; at least one of the first nitrogenated carbon material 104 and the second nitrogenated carbon material 108 may have a non-uniform nitrogen concentration profile that is varied stepwise and the third nitrogenated carbon material 112 may have a non-uniform nitrogen concentration profile that is varied continuously; at least one of the first nitrogenated carbon material 104 and the second nitrogenated carbon material 108 may have a non-uniform nitrogen concentration profile that is varied continuously and the third nitrogenated carbon material 112 may have a non-uniform nitrogen concentration profile that is varied stepwise; the third nitrogenated carbon material 108 may have a non-uniform nitrogen concentration profile that is varied stepwise in a manner substantially similar to or different than that of at least one of the first nitrogenated carbon material 104 and the second nitrogenated carbon material 108; or the third nitrogenated carbon material 108 may have a non-uniform nitrogen concentration profile that is varied continuously in a manner substantially similar to or different than that of at least one of the first nitrogenated carbon material 104 and the second nitrogenated carbon material 108.

Similar to each of the first nitrogenated carbon material 104 and the second nitrogenated carbon material 108 previously described, a thickness of the third nitrogenated carbon material 112 may be selected at least partially based on material characteristics of one or more other components of the phase change memory cell 100. The thickness of the third nitrogenated carbon material 112 may be within a range of from about 100 Å to about 2000 Å, such as about 300 Å to about 1500 Å. In at least some embodiments, the thickness of the third nitrogenated carbon material 112 is about 1000 Å. The thickness of the third nitrogenated carbon material 112 may be greater than, less than, or equal to the thickness of each of the first nitrogenated carbon material 104 (if present) and the second nitrogenated carbon material 108.

The third nitrogenated carbon material 112 may be formed on the threshold switching material 110 in a manner substantially similar to that described above with respect to forming the first nitrogenated carbon material 104 on the first electrode 102.

The second electrode 114 may include any suitable conductive material including, but not limited to, a metal, a metal alloy, a conductive metal oxide, or combinations thereof. By way of non-limiting example, the second electrode 114 may be formed of W, WN, Ni, TaN, Pt, Au, TiN, TiSiN, TiAlN, or MoN. The second electrode 114 may be formed of substantially the same material as the first electrode 102 or may be a different material than the first electrode 102. In at least some embodiments, the second electrode 114 is formed from W. The second electrode 114 may be formed on the third nitrogenated carbon material 112 using conventional techniques, such as PVD, CVD, or ALD, which are not described in detail herein.

Figure 2:
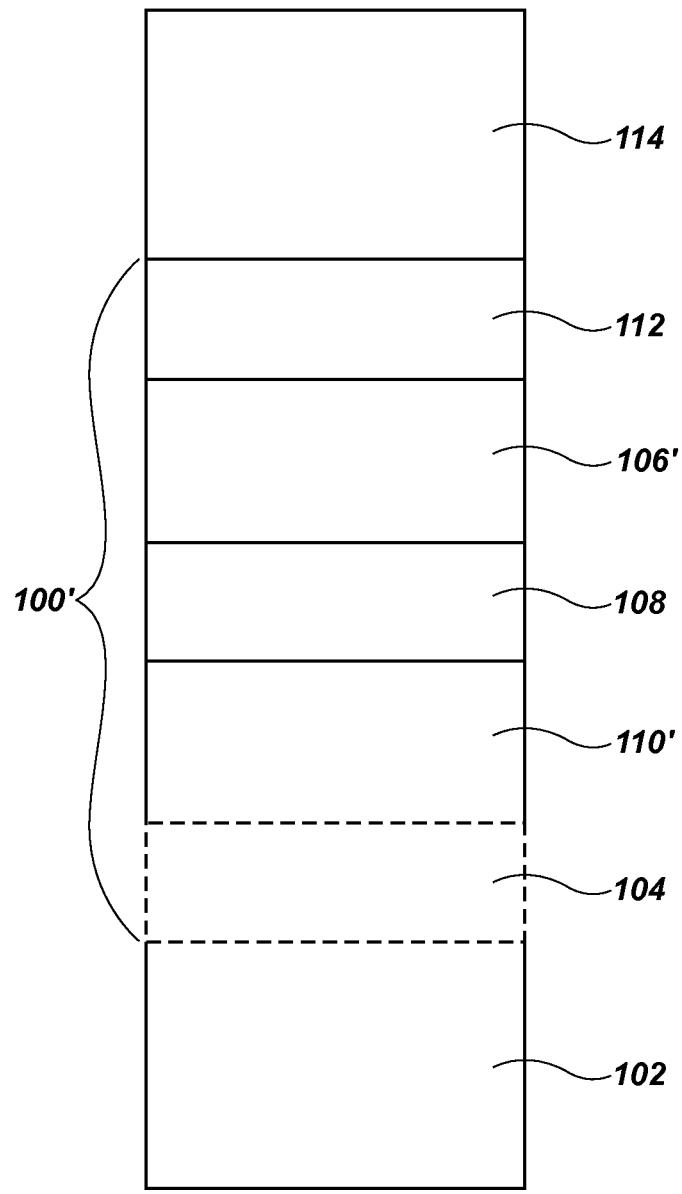
FIG. 2 is a cross-sectional view of another phase change memory cell, in accordance with an embodiment of the disclosure.

In further embodiments, relative positions of the phase change material 106 and the threshold switching material 110 may be different than described above. For example, as illustrated in FIG. 2, a phase change memory cell 100' may include each component of the phase change memory cell 100 (FIG. 1) previously described (i.e., the optional first nitrogenated carbon material 104, a phase change material 106', the second nitrogenated carbon material 108, a threshold switching material 110', and the third nitrogenated carbon material 112), except that the relative positions of the phase change material 106' and the threshold switching material 110' may be switched or reversed. The first nitrogenated carbon material 104 may, optionally, be formed on the first electrode 102, the threshold switching material 110' may be formed on the first nitrogenated carbon material 104 (if present), the second nitrogenated carbon material 108 may be formed on the threshold switching material 110', the phase change material 106' may be formed on the second nitrogenated carbon material 108, the third nitrogenated carbon material 112 may be formed on the phase change material 106', and the second electrode 114 may be formed on the third nitrogenated carbon material 112. Other than the described difference in the relative positions of the phase change material 106' and the threshold switching material 110', each component of the phase change memory cell 100' may be formed in a manner substantially similar to that described above with respect to each corresponding component of the phase change memory cell 100 (FIG. 1).

An embodiment of a phase change memory cell is disclosed. The phase change memory cell comprises a first chalcogenide compound on a first electrode, a first nitrogenated carbon material directly on the first chalcogenide compound, a second chalcogenide compound directly on the first nitrogenated carbon material, and a second nitrogenated carbon material directly on the second chalcogenide compound and directly on a second electrode.

A method of forming a phase change memory cell is also disclosed. The method comprises forming a first chalcogenide compound on a first electrode, forming a first nitrogenated carbon material directly on the first chalcogenide compound, forming a second chalcogenide compound on the first nitrogenated carbon material, and forming a second nitrogenated carbon material directly on the second chalcogenide compound.

Figure 3:
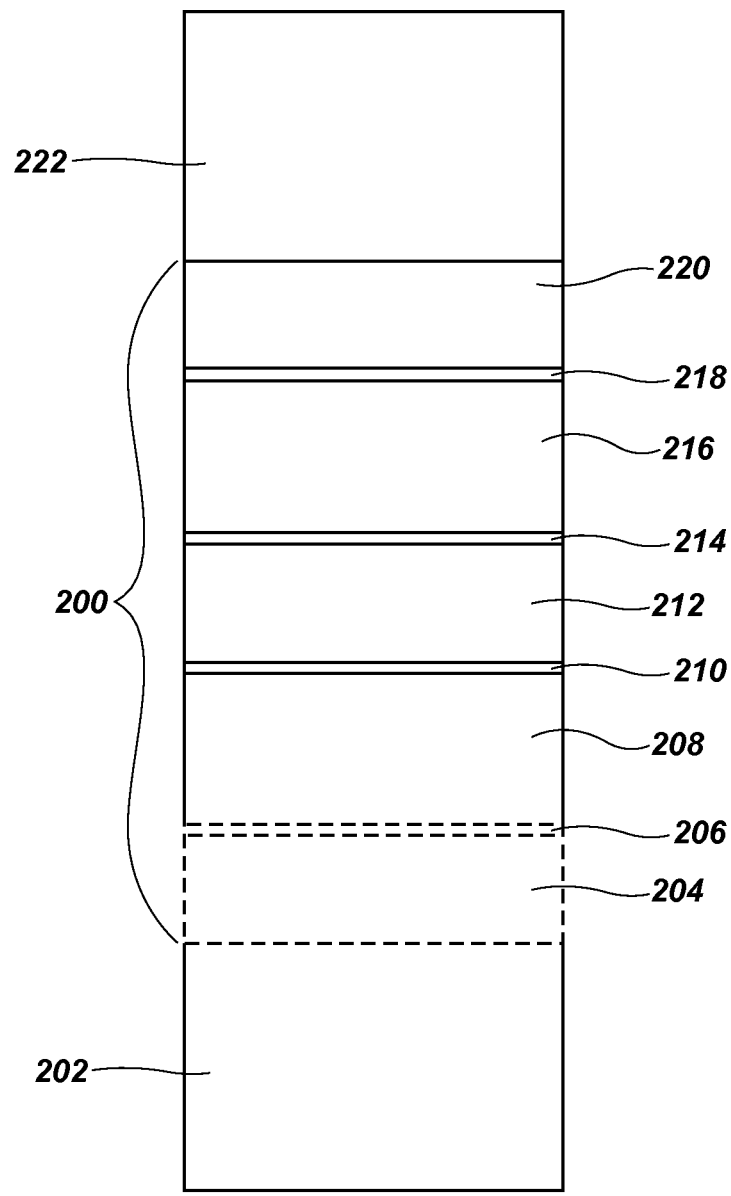
FIG. 3 is a cross-sectional view of yet another phase change memory cell, in accordance with yet another embodiment of the disclosure.

Another embodiment of the present disclosure will now be described with reference to FIG. 3, which illustrates a phase change memory cell 200 including an optional first carbon material 204, an optional first nitrogenated carbon material 206, a phase change material 208, a second nitrogenated carbon material 210, a second carbon material 212, a third nitrogenated carbon material 214, a threshold switching material 216, a fourth nitrogenated carbon material 218, and a third carbon material 220. As used herein, the term "carbon material" means and includes a material including carbon atoms but lacking nitrogen atoms. The term "carbon material" is used in contrast to the term "nitrogenated carbon material" in which both carbon atoms and nitrogen atoms are present. The nitrogenated carbon material may include trace amounts of additional elements, such as oxygen, hydrogen, or various metals. These elements may be present in small amounts, such as in impurity concentrations. The phase change memory cell 200 may be coupled to a first electrode 202 and a second electrode 222. The first carbon material 204 may, optionally, be formed on the first electrode 202, the first nitrogenated carbon material 206 may be formed on the first carbon material 204 (if present), the phase change material 208 may be formed on the first nitrogenated carbon material 206 (if present), the second nitrogenated carbon material 210 may be formed on the phase change material 208, the second carbon material 212 may be formed on the second nitrogenated carbon material 210, the third nitrogenated carbon material 214 may be formed on the second carbon material 212, the threshold switching material 216 may be formed on the third nitrogenated carbon material 214, the fourth nitrogenated carbon material 218 may be formed on the threshold switching material 216, the third carbon material 220 may be formed on the fourth nitrogenated carbon material 218, and the second electrode 222 may be formed on the third carbon material 220.

The first carbon material 204, if present, may include a plurality of carbon atoms. The first carbon material 204 is configured to conduct current to the phase change material 208. A thickness of the first carbon material 204 may be selected at least partially based on material characteristics of at least one other component of the phase change memory cell 200 (e.g., electrical resistance of one or more of the first nitrogenated carbon material 206, the phase change material 208, the second nitrogenated carbon material 210, the second carbon material 212, the third nitrogenated carbon material 214, and the threshold switching material 216). The thickness of the first carbon material 204 may be within a range of from about 100 Å to about 2000 Å, such as about 300 Å to about 1500 Å. The first carbon material 204 may be formed on the first electrode 202 using conventional techniques, such as PVD, CVD, or ALD, which are not described in detail herein. The first electrode 202 may be substantially similar to and may be formed in a substantially similar manner as the first electrode 102 described above.

The first nitrogenated carbon material 206 may be substantially similar to the first nitrogenated carbon material 104 previously described, except that the first nitrogenated carbon material 206 may have a reduced thickness compared to the thickness of the first nitrogenated carbon material 104 described above. The thickness of the first nitrogenated carbon material 206 may be within a range of from about 5 Å to about 100 Å, such as from about 5 Å to about 50 Å, or from about 5 Å to about 25 Å. The first nitrogenated carbon material 206 may function as an adhesion material to bind or adhere the first carbon material 204 to the phase change material 208. The first nitrogenated carbon material 206 may provide increased adhesion strength between the first carbon material 204 and the phase change material 208 relative to forming the phase change material 208 directly on the first carbon material 204, reducing a risk of delamination. The adhesion strength between the first carbon material 204 and the phase change material 208 may be measured by the fracture energy sufficient to cause an adhesion failure between first carbon material 204 and the phase change material 208. The adhesion strength may be determined in a four point bend test, as known in the art. A high adhesion strength corresponds to a high fracture energy sufficient to cause the adhesion failure, or delamination, of the first carbon material 204 and the phase change material 208. The first nitrogenated carbon material 206 may formed on the first carbon material 204, if present, in a manner substantially similar to that previously described with respect to forming the first nitrogenated carbon material 104 on the first electrode 102. Optionally, the first carbon material 204 and the first nitrogenated carbon material 206 may be formed in sequentially through a controlled introduction of nitrogen. For example, within a deposition chamber (e.g., a PVD chamber, as described above), a flow of nitrogen gas may initially be withheld to form of the first carbon material 204, and may be subsequently enabled to form the first nitrogenated carbon material 206 on the first carbon material 204. If the first carbon material 204 is not present, the first nitrogenated carbon material 206 may be omitted.

The phase change material 208, the threshold switching material 216, and the second electrode 222 maybe substantially similar to and may be formed in a substantially similar manner as the phase change material 106, the threshold switching material 110, and the second electrode 114 described above, respectively.

Each of the second carbon material 212 and the third carbon material 220 may include a plurality of carbon atoms. The second carbon material 212 and the third carbon material 220 conduct current to the threshold switching material 216 and the second electrode 222, respectively. Similar to the first carbon material 204 described above, a thickness of each of the second carbon material 212 and the third carbon material 220 may be selected based on material characteristics of at least one other component of the phase change memory cell 200. The thickness of each of the second carbon material 212 and the third carbon material 220 may be within a range of from about 100 Å to about 2000 Å, such as from about 300 Å to about 1500 Å. The thickness of at least one of the first carbon material 204 (if present), the second carbon material 212, and the third carbon material 220 may be substantially the same as the thickness of at least one other of the first carbon material 204 (if present), the second carbon material 212, and the third carbon material 220. Conversely, the thickness of each of the first carbon material 204 (if present), the second carbon material 212, and the third carbon material 220 may be different. Each of the second carbon material 212 and the third carbon material 220 may be formed using conventional techniques, such as PVD, CVD, or ALD, which are not described in detail herein.

Each of the second nitrogenated carbon material 210, the third nitrogenated carbon material 214, and the fourth nitrogenated carbon material 218 may be substantially similar to the first nitrogenated carbon material 104 previously described, except that each may have a reduced thickness as compared to the thickness of the first nitrogenated carbon material 104. The second nitrogenated carbon material 210, the third nitrogenated carbon material 214, and the fourth nitrogenated carbon material 218 may function as an adhesion material in a manner substantially similar to that described above for the first nitrogenated carbon material 204. The thickness of each of the second nitrogenated carbon material 210, the third nitrogenated carbon material 214, and the fourth nitrogenated carbon material may be within a range of from about 5 Å to about 100 Å, such as from about 5 Å to about 50 Å, or from about 5 Å to about 25 Å. The thickness of at least one of the first nitrogenated carbon material 206 (if present), the second nitrogenated carbon material 210, the third nitrogenated carbon material 214, and the fourth nitrogenated carbon material 218 may be substantially the same as the thickness of at least one other of the first nitrogenated carbon material 206 (if present), the second nitrogenated carbon material 210, the third nitrogenated carbon material 214, and the fourth nitrogenated carbon material 218. Conversely, the thicknesses of each of the first nitrogenated carbon material 206 (if present), the second nitrogenated carbon material 210, the third nitrogenated carbon material 214, and the fourth nitrogenated carbon material 218 may be different from one another. Each of the second nitrogenated carbon material 210, the third nitrogenated carbon material 214, and the fourth nitrogenated carbon material 218 may impart increased adhesion strength to the phase change memory cell 200 relative to directly joining or bonding 18 components of the phase change memory cell 200 adjacent opposing sides of each nitrogenated carbon material (e.g., forming the second carbon material 212 directly on the phase change material 208, forming the threshold switching material 216 on the second carbon material 212, and forming the third carbon material on the threshold switching material 216). The method of forming each of the first nitrogenated carbon material 206, the second nitrogenated carbon material 210, the third nitrogenated carbon material 214, and the fourth nitrogenated carbon material 218 may be substantially similar to that previously described with respect to the first nitrogenated carbon material 206.

Figure 4:
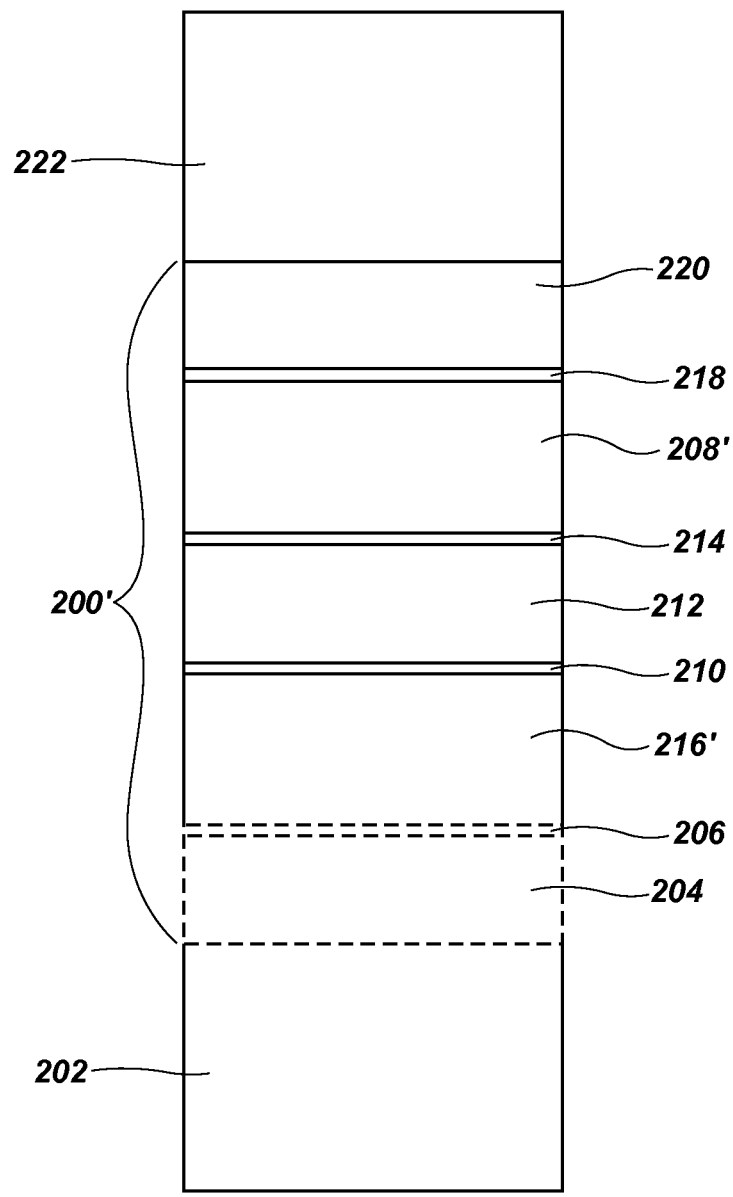
FIG. 4 is a cross-sectional view of still yet another phase change memory cell, in accordance with yet another embodiment of the disclosure.

In yet further embodiments, relative positions of a phase change material 208' and a threshold switching material 216' may be different than described above in FIG. 3. For example, as illustrated in FIG. 4, a phase change memory cell 200' may include each component of the phase change memory cell 200 (FIG. 3) previously described (i.e., the optional first carbon material 204, the optional first nitrogenated carbon material 206, the phase change material 208', the second nitrogenated carbon material 210, the second carbon material 212, the third nitrogenated carbon material 214, the threshold switching material 216', the fourth nitrogenated carbon material 218, and the third carbon material 220), except that the relative positions of the phase change material 208 and the threshold switching material 216 may be switched or reversed. The first carbon material 204 may, optionally, be formed on the first electrode 202, the first nitrogenated carbon material 206 may be formed on the first carbon material 204 (if present), the threshold switching material 216' may be formed on the first nitrogenated carbon material 206 (if present), the second nitrogenated carbon material 210 may be formed on the threshold switching material 216', the second carbon material 212 may be formed on the second nitrogenated carbon material 210, the third nitrogenated carbon material 214 may be formed on the second carbon material 212, the phase change material 208' may be formed on the third nitrogenated carbon material 214, the fourth nitrogenated carbon material 218 may be formed on the phase change material 208', the third carbon material 220 may be formed on the fourth nitrogenated carbon material 218, and the second electrode 222 may be formed on the third carbon material 220. Other than the described difference in the relative positions of the phase change material 208' and the threshold switching material 216', each component of the phase change memory cell 200' may be formed in a manner substantially similar to that described above with respect to each corresponding component of the phase change memory cell 200 (FIG. 3).

Another embodiment of a phase change memory cell is disclosed. The phase change memory cell comprises a first chalcogenide compound on a first electrode, a first nitrogenated carbon material directly on the first chalcogenide compound, a first carbon material directly on the first nitrogenated carbon material, a second nitrogenated carbon material directly on the first carbon material, a second chalcogenide compound directly on the second nitrogenated carbon material, a third nitrogenated carbon material directly on the second chalcogenide compound, and a second carbon material directly on the third nitrogenated carbon material and directly on a second electrode.

Figure 5:
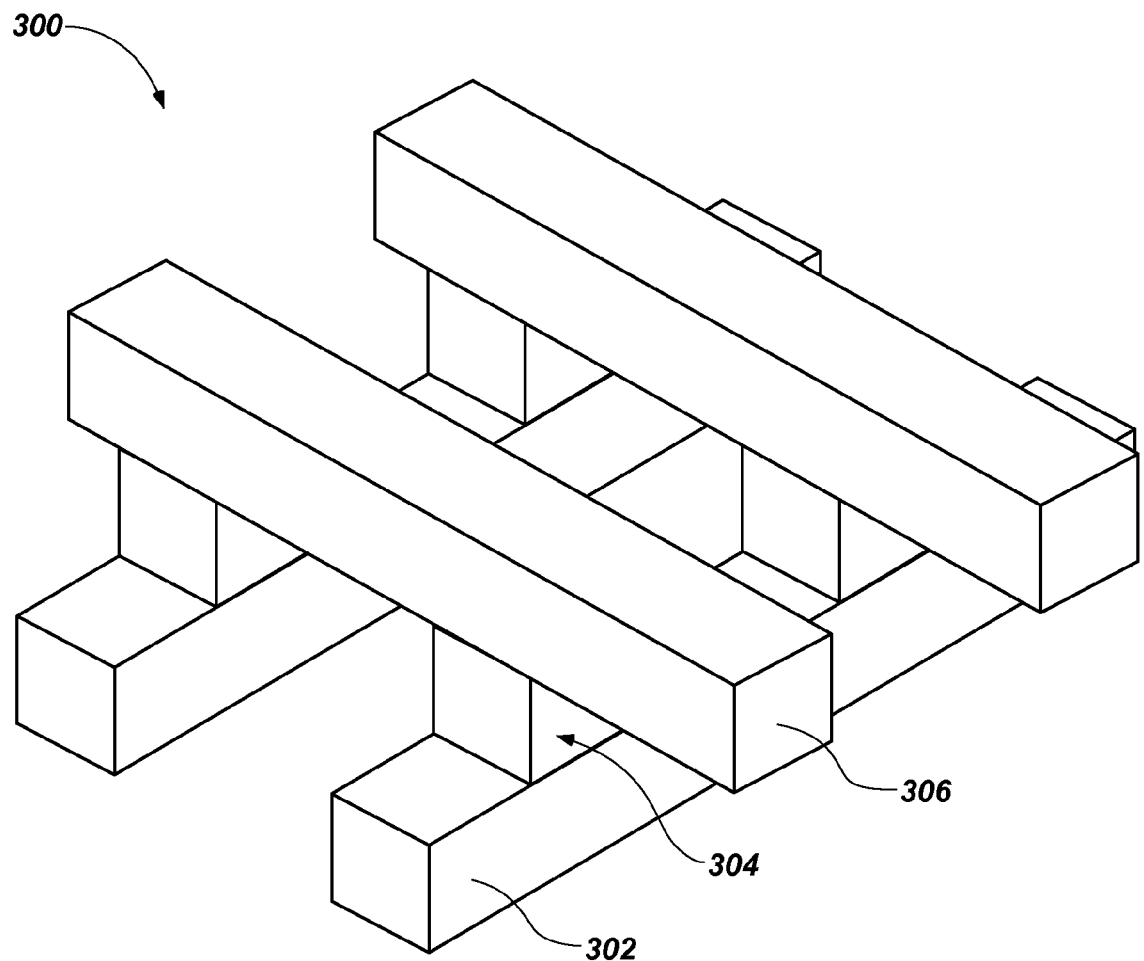
FIG. 5 is a perspective view of a phase change memory cell array including a plurality of phase change memory cells of the present disclosure.

FIG. 5 illustrates an embodiment of a phase change memory array 300 including a plurality of the phase change memory cells 304. The phase change memory cells 304 may be one of the phase change memory cells 100, 100', 200, 200' previously described. The plurality of the phase change memory cells 304 may be positioned between a plurality of word lines 302 and a plurality of digit lines 306. The plurality of word lines 302 may correspond to one of the first electrodes 102, 202 previously described. The plurality of digit lines 306 may correspond to one of the second electrodes 114, 222 previously described. The relative positions of the plurality of word lines 302 and the plurality of digit lines 306 illustrated in FIG. 5 may be switched where an arrangement of the materials of the phase change memory cells 304 is modified accordingly. Each of the word lines 302 may extend in a first direction and may connect a row of the phase change memory cells 304. Each of the digit lines 306 may extend in a second direction at least substantially perpendicular to the first direction and may connect a column of the phase change memory cells 304. Each phase change memory cell 304 may include a word line node (not shown) coupled to a respective word line 302, and a digit line node (not shown) coupled to a respective digit line 306. A voltage applied to the word lines 302 and digit lines 306 may be controlled such that an electric field may be selectively applied to at least one word line 302 and to at least one digit line 306, enabling the phase change memory cells 304 to be selectively operated. Accordingly, a phase change memory device may be formed which includes a phase change memory array 300.

Figure 6:
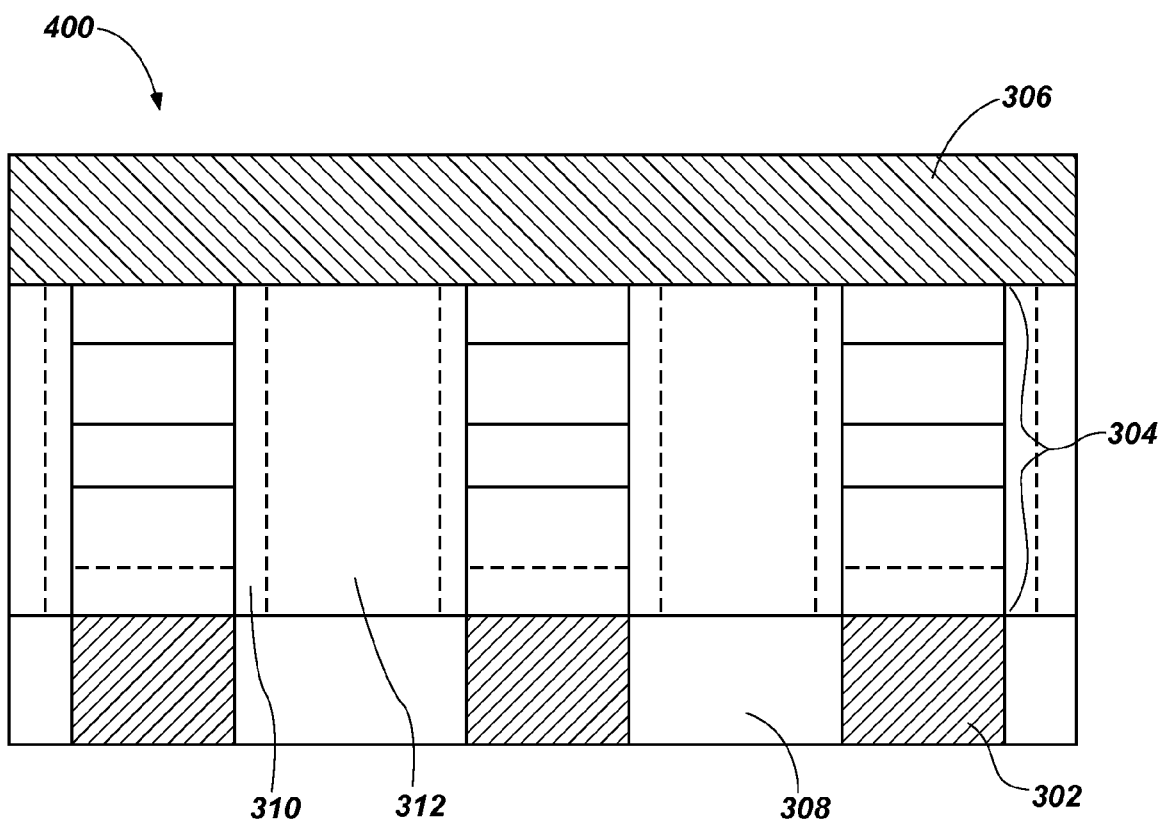
FIG. 6 is a cross-sectional view of a phase change memory device in accordance with an embodiment of the present disclosure.

FIG. 6 illustrates a phase change memory device 400 in accordance with an embodiment of the present disclosure. The phase change memory device 400 may include the phase change memory array 300 (FIG. 5) including the plurality of phase change memory cells 304, the plurality of word lines 302, the plurality of digit lines 306, an insulator material 308, a first dielectric material 310, and a optional second dielectric material 312. Each of the insulator material 308, the first dielectric material 310, and the optional second dielectric material 312 may be a suitable insulative or dielectric material known in the art including, but not limited to, silicon oxide, silicon nitride, silicon oxynitride, a spin-on-glass (SOG), a phosphosilicate glass (PSG), tetraethyl orthosilicate (TEOS), or borophosilicate glass (BPSG). The phase change memory device 400 may be formed by conventional techniques.

An embodiment of a phase change memory device is also disclosed. The phase change memory device comprises a plurality of word lines, a plurality of digit lines perpendicular to the plurality of word lines, and a plurality of phase change memory cells arranged in an array of rows and columns. Each phase change memory cell of the plurality of phase change memory cells is coupled to a respective word line of the plurality of word lines and coupled to a respective digit line of the plurality of digit lines. Each phase change memory cell comprises a first chalcogenide compound, a first nitrogenated carbon material directly on the first chalcogenide compound, a second chalcogenide compound on the first nitrogenated carbon material, and a second nitrogenated carbon material directly on the second chalcogenide compound.

Figure 7A:
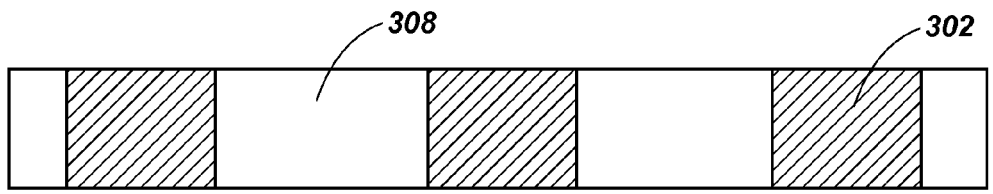
FIGS. 7A-7E are cross-sectional views illustrating different process stages and structures for a method of forming the phase change memory device of FIG. 6.
Figure 7B:
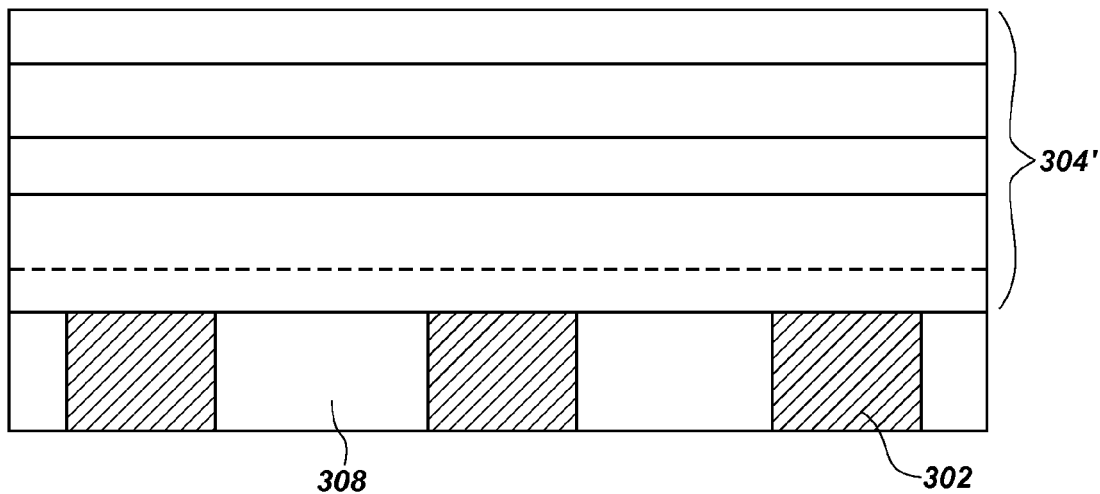
Figure 7C:
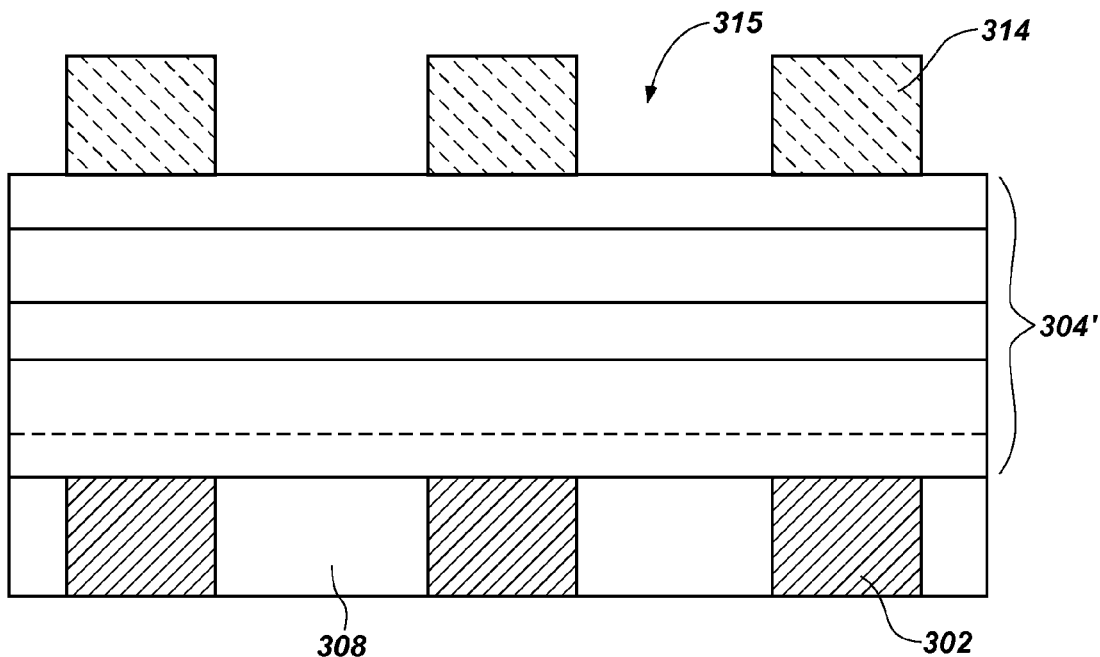
Figure 7D:
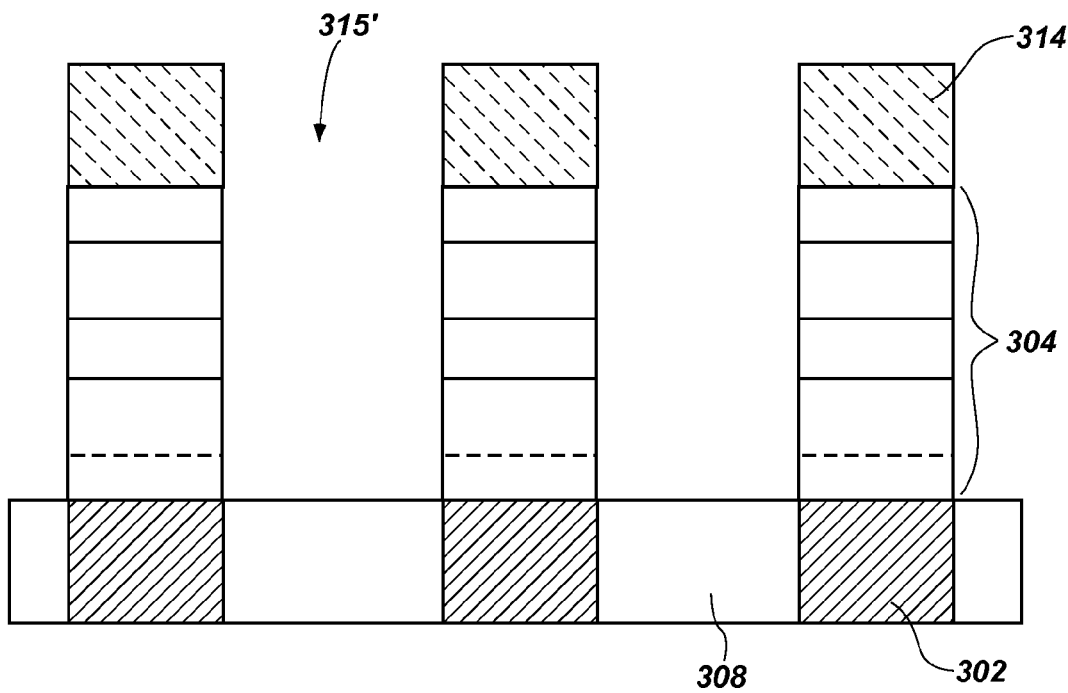
Figure 7E:
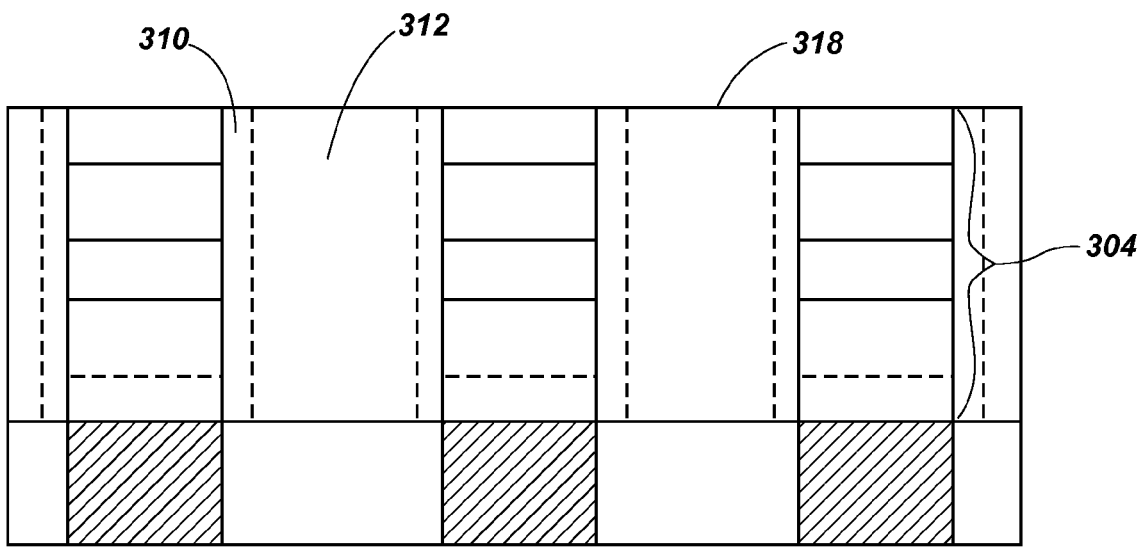

By way of non-limiting example and as illustrated in FIG. 7A, the plurality of word lines 302 may be formed in the insulator material 308 using conventional techniques, which are not described in detail herein. As shown in FIG. 7B, a phase change memory cell 304' may be formed on the plurality of word lines 302 and insulator material 308 in a manner substantially similar to that previously described for one of the phase change memory cells 100, 100', 200, 200'. As illustrated in FIG. 7C, a plurality of openings 315 may be formed in a hardmask 314 overlying the phase change memory cell 304'. The openings 315 may be used as a mask to transfer a corresponding pattern into the phase change memory cell 304' to form the plurality of phase change memory cells 304 and openings 315', as depicted in FIG. 7D. Remaining portions of the hardmask 314 may be removed (e.g., by etching or chemical mechanical planarization), the first dielectric material 310 may optionally be formed over the plurality of phase change memory cells 304, the plurality of openings 315' may be filled with the dielectric material 312, and a portion of at least one of the first dielectric material 310 (if present), the second dielectric material 312, and the plurality of phase change memory cells 304 may be removed (e.g., by chemical mechanical planarization) to form a substantially planar surface 318, as depicted in FIG. 7E. The plurality of digit lines 306 may then be formed on the substantially planar surface 318 using conventional techniques to form the phase change memory device 400 illustrated in FIG. 6.

In use and operation, the word lines 302 and the digit lines 306 of the phase change memory device 400 are connected to circuitry (not shown) configured to program and read the phase change memory device 400. Current delivered to the plurality of word lines 302 (e.g., by electrical contact with an interconnect) may flow through the plurality of phase change memory cells 304, and to the plurality of digit lines 306. By way of non-limiting example and referring to FIG. 1, if the plurality of phase change memory cells 304 (FIG. 6) are the phase change memory cells 100 described above, current from the plurality of word lines 302 (FIG. 6) may flow through the optional first nitrogenated carbon material 104, the phase change material 106, the second nitrogenated carbon material 104, the threshold switching material 110, and the third nitrogenated carbon material 112, to the digit lines 306 (FIG. 6). As the current passes through the phase change material 106, at least one detectable property change (e.g., an electrical resistivity change, as described above) may occur and be utilized to distinguish logic values of the phase change memory cell 100 as desired.

The phase change memory cells 100, 100', 200, 200' and phase change memory device 400 of the present disclosure advantageously reduce energy demands, increase memory lifespan, and decrease performance degradation issues as compared to conventional phase change memory cells and devices. For example, the nitrogenated carbon materials included in the phase change memory cells 100, 100', 200, 200' and phase change memory device 400 described above provide increased resistivity relative to conventional electrodes, enabling the generation of more heat for the phase change material and reducing energy consumption. The nitrogenated carbon materials also exhibit increased adhesion strength, improved resistivity stability, increased surface smoothness, and decreased reactivity as compared to conventional electrodes (e.g., carbon, TiN), facilitating enhanced durability and improved reliability. Providing the nitrogenated carbon materials on opposing sides of at least the phase change material of the phase change memory cells 100, 100', 200, 200' may also increase heat retention within the phase change material, resulting in relatively improved data retention characteristics.

The following example serves to explain embodiments of the present disclosure in more detail. The example is not to be construed as being exhaustive or exclusive as to the scope of the disclosure.

EXAMPLES

Example 1

Figure 8:
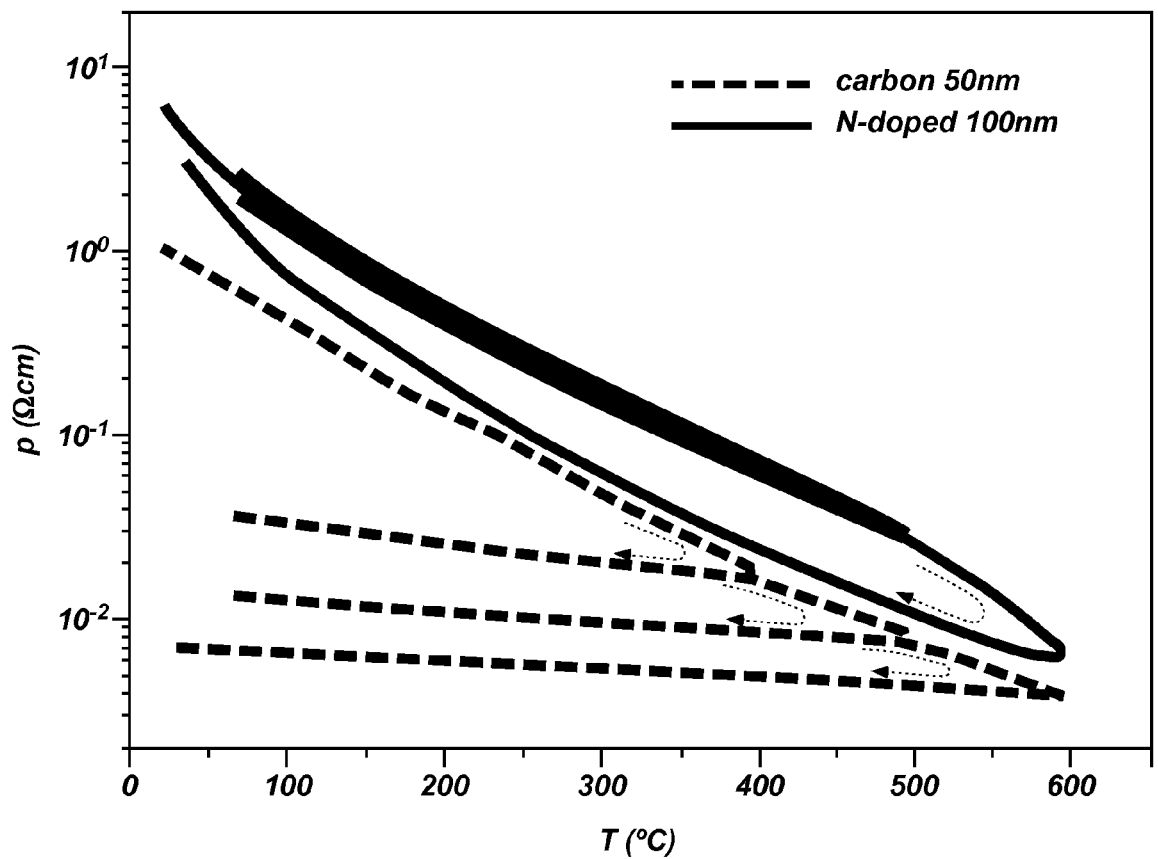
FIG. 8 is a graphical representation of the resistivity stability of a nitrogenated carbon material as a function of temperature as described in Example 1.

A graphical representation of the resistivity stability of a nitrogenated carbon material at different annealing temperatures relative to a carbon material at different annealing temperatures is shown in FIG. 8. A nitrogenated carbon material containing 5 atomic percent nitrogen was sputtered on silicon oxide substrates (8 inch wafers including 100 nm of oxide) to a thickness of 1000 Å. A carbon material was sputtered on silicon oxide substrates (8 inch wafers including 100 nm of oxide) to a thickness of 500 Å. The samples were segmented, and resistivity of the nitrogenated carbon material and the carbon material was measured using the Van der Pauw four-point probe methodology. In FIG. 8, the x-axis refers to an annealing temperature (° C.), and the y-axis refers to a resistivity ($\Omega$cm). As depicted in FIG. 8, across three separate heating cycles sequentially tested (i.e., ambient temperature→400° C.→ambient temperature; ambient temperature→500° C.→ambient temperature; and ambient temperature→600° C.→ambient temperature), the initial resistivity and the final resistivity of the nitrogenated carbon material (represented by the solid lines) was more reproducible than the initial resistivity and the final resistivity of the carbon material (represented by the dashed lines). In addition, the resistivity of the nitrogenated carbon materials was found to be substantially independent of the thermal history of the nitrogenated carbon material, and no hysteresis or degradation of the nitrogenated carbon materials was observed.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A phase change memory cell, comprising:
   a first chalcogenide compound on a first electrode;
   a first nitrogenated carbon material directly on the first chalcogenide compound;
   a first carbon material directly on the first nitrogenated carbon material;
   a second nitrogenated carbon material directly on the first carbon material;
   a second chalcogenide compound directly on the second nitrogenated carbon material;
   a third nitrogenated carbon material directly on the second chalcogenide compound; and
   a second carbon material directly on the third nitrogenated carbon material and directly on a second electrode, the second nitrogenated carbon material and the first nitrogenated carbon material each independently comprising greater than or equal to about 80 atomic percent carbon and less than or equal to about 20 atomic percent nitrogen.

2. The phase change memory cell of claim 1, further comprising:
   a third carbon material directly on the first electrode; and
   a fourth nitrogenated carbon material directly on the third carbon material and directly on the first chalcogenide compound.

3. The phase change memory cell of claim 1, wherein the first chalcogenide compound comprises at least one of $Sb_2Te_3$, GeTe, $In_2Se_3$, SnTe, $Bi_2Te_3$, SbTe, SnSe, GeSe, GaSeTe, $Ge_2Sb_2Te_5$, $SnSb_2Te_4$, $Au_{25}Ge_4Sn_{11}Te_{60}$, AgInSbTe, $Ag_2Se$, InTe, and InSbTe.

4. The phase change memory cell of claim 1, wherein the first chalcogenide compound comprises at least one of $As_2Te_3$, $As_2Se_3$, $As_{30}Te_{45}Ge_{25}$, $As_{28}Se_{42}Ge_{30}$, $As_{30}Si_{12}Se_{33}Ge_{25}$, and $As_{37}Te_{39}Ge_9Si_{14}In$.

5. The phase change memory cell of claim 1, wherein each of the first nitrogenated carbon material and the second nitrogenated carbon material, independently, comprises from about 90 atomic percent carbon to about 99.9 atomic percent carbon and from about 0.10 atomic percent nitrogen to about 10 atomic percent nitrogen.

6. The phase change memory cell of claim 1, wherein a thickness of each of the first nitrogenated carbon material, the second nitrogenated carbon material, and the third nitrogenated carbon material is within a range of from about 5 Å to about 100 Å.

7. The phase change memory cell of claim 1, wherein at least one of the first nitrogenated carbon material, the second nitrogenated carbon material, and the third nitrogenated carbon material comprises a non-uniform nitrogen concentration profile.

8. A method of forming a phase change memory cell, comprising:
   forming a first chalcogenide compound on a first electrode;
   forming a first nitrogenated carbon material directly on the first chalcogenide compound;
   forming a first carbon material directly on the first nitrogenated carbon material;
   forming a second nitrogenated carbon material directly on the first carbon material;
   forming a second chalcogenide compound on the second first nitrogenated carbon material;
   forming a third nitrogenated carbon material directly on the second chalcogenide compound; and
   forming a second carbon material directly on the third nitrogenated carbon material.

9. The method of claim 8, wherein forming the first nitrogenated carbon material directly on the first chalcogenide compound comprises forming the first nitrogenated carbon material to comprise greater than or equal to about 80 atomic percent carbon and less than or equal to about 20 atomic percent nitrogen.

10. The method of claim 9, wherein forming the second nitrogenated carbon material directly on the first carbon material comprises forming the second nitrogenated carbon material to comprise greater than or equal to about 80 atomic percent carbon and less than or equal to about 20 atomic percent nitrogen.

11. The method of claim 10, wherein forming the third nitrogenated carbon material directly on the second chalcogenide compound comprises forming the third nitrogenated carbon material to comprise greater than or equal to about 80 atomic percent carbon and less than or equal to about 20 atomic percent nitrogen.

12. The method of claim 8, wherein forming the second nitrogenated carbon material directly on the first carbon material comprises forming the second nitrogenated carbon material to exhibit a different thickness than the first nitrogenated carbon material.

13. The method of claim 12, wherein forming the third nitrogenated carbon material directly on the second chalcogenide compound comprises forming the third nitrogenated carbon material to exhibit a different thickness than at least one of the first nitrogenated carbon material or the second nitrogenated carbon material.

14. The method of claim 8, wherein forming the first chalcogenide compound comprises forming the first chalcogenide compound to comprise at least one of $Sb_2Te_3$, GeTe, $In_2Se_3$, SnTe, $Bi_2Te_3$, SbTe, SnSe, GeSe, GaSeTe, $Ge_2Sb_2Te_5$, $SnSb_2Te_4$, $Au_{25}Ge_4Sn_{11}Te_{60}$, AgInSbTe, $Ag_2Se$, InTe, or InSbTe.

15. The method of claim 8, wherein forming the second chalcogenide compound comprises forming the second chalcogenide compound to comprise at least one of $As_2Te_3$, $As_2Se_3$, $As_{30}Te_{45}Ge_{25}$, $As_{25}Se_{42}Ge_{30}$, $As_{30}Si_2Se_{33}Ge_{25}$, or $As_{37}Te_{39}Ge_9Si_{14}In$.

16. The phase change memory cell of claim 1, wherein the third nitrogenated carbon material comprises greater than or equal to about 80 atomic percent carbon and less than or equal to about 20 atomic percent nitrogen.

17. The phase change memory cell of claim 1, wherein at least one of the first nitrogenated carbon material, the second nitrogenated carbon material, or the third nitrogenated carbon material exhibits a different thickness than at least one other of the first nitrogenated carbon material, the second nitrogenated carbon material, or the third nitrogenated carbon material.

18. The phase change memory cell of claim 1, wherein at least one of the first nitrogenated carbon material, the second nitrogenated carbon material, or the third nitrogenated carbon material exhibits a uniform nitrogen concentration profile, and at least one other of the first nitrogenated carbon material, the second nitrogenated carbon material, or the third nitrogenated carbon material exhibits a non-uniform nitrogen concentration profile.

19. The phase change memory cell of claim 1, wherein each of the first nitrogenated carbon material, the second nitrogenated carbon material, and the third nitrogenated carbon material consist of carbon and nitrogen.

20. A phase change memory cell, comprising:
   a first chalcogenide compound on a first electrode;
   a first nitrogenated carbon material directly on the first chalcogenide compound;
   a first carbon material directly on the first nitrogenated carbon material;
   a second nitrogenated carbon material directly on the first carbon material;
   a second chalcogenide compound directly on the second nitrogenated carbon material;
   a third nitrogenated carbon material directly on the second chalcogenide compound, the third nitrogenated carbon material exhibiting a different thickness than at least one of the first nitrogenated carbon material or the second nitrogenated carbon material; and
   a second carbon material directly on the third nitrogenated carbon material and directly on a second electrode.

* * * * *

UNITED STATES PATENT AND TRADEMARK OFFICE
CERTIFICATE OF CORRECTION

PATENT NO. : 9,299,929 B2  Page 1 of 1
APPLICATION NO. : 14/727106
DATED : March 29, 2016
INVENTOR(S) : Andrea Gotti et al.

It is certified that error appears in the above-identified patent and that said Letters Patent is hereby corrected as shown below:

In the specification:

COLUMN 7, LINE 66, change "about 7000 Å, such" to --about 2000 Å, such--

In the claims:

CLAIM 8, COLUMN 17, LINES 18-19, change "the second first nitrogenated" to --the second nitrogenated--

Signed and Sealed this
Fourteenth Day of June, 2016

Michelle K. Lee
*Director of the United States Patent and Trademark Office*